(12) United States Patent
Khor

(10) Patent No.: US 8,767,404 B2
(45) Date of Patent: Jul. 1, 2014

(54) DECOUPLING CAPACITOR CIRCUITRY

(75) Inventor: Chin Hieang Khor, Tanjung Piandang (MY)

(73) Assignee: Altera Corporation, San Jose, CA (US)

( * ) Notice: Subject to any disclaimer, the term of this patent is extended or adjusted under 35 U.S.C. 154(b) by 150 days.

(21) Appl. No.: 13/175,724

(22) Filed: Jul. 1, 2011

(65) Prior Publication Data

US 2013/0001664 A1 Jan. 3, 2013

(51) Int. Cl.
*H05K 7/00* (2006.01)

(52) U.S. Cl.
USPC .......... 361/734; 257/300; 257/E21.615; 257/E27.034; 438/239; 361/306.2

(58) Field of Classification Search
USPC .......... 257/300, E21.615, E27.034; 438/239; 361/734, 306.2
See application file for complete search history.

(56) References Cited

U.S. PATENT DOCUMENTS

| | | | |
|---|---|---|---|
| 6,038,122 A | 3/2000 | Bergstedt | |
| 6,396,123 B1 | 5/2002 | Nagaoka | |
| 7,222,320 B2 | 5/2007 | Ogawa | |
| 7,262,951 B2 | 8/2007 | Hou et al. | |
| 7,309,906 B1 | 12/2007 | Tyhach | |
| 7,355,265 B2 * | 4/2008 | Kinoshita | 257/532 |
| 7,791,168 B2 | 9/2010 | Horton | |
| 2003/0072126 A1 | 4/2003 | Bhattacharyya | |
| 2005/0088801 A1 | 4/2005 | Shih | |
| 2006/0226462 A1 | 10/2006 | Ota | |
| 2008/0230820 A1 | 9/2008 | Maeda et al. | |
| 2009/0057826 A1 | 3/2009 | Kim et al. | |
| 2009/0170237 A1 | 7/2009 | Olariu | |
| 2009/0207552 A1 | 8/2009 | Frederick, Jr. | |
| 2009/0256180 A1 | 10/2009 | Azuma | |
| 2010/0078695 A1 * | 4/2010 | Law et al. | 257/296 |
| 2010/0148304 A1 | 6/2010 | Rahim et al. | |

* cited by examiner

*Primary Examiner* — David Vu
*Assistant Examiner* — Brandon Fox
(74) *Attorney, Agent, or Firm* — Treyz Law Group; Chih-Yun Wu

(57) ABSTRACT

Integrated circuits with decoupling capacitor circuitry are provided. The decoupling capacitor circuitry may include density-compliance structures. The density-compliance structures may be strapped to metal paths driven by power supply lines. Strapping density-compliance dummy structures in this way may increase the capacitance per unit area of the decoupling capacitor circuitry. Strapping density-compliance dummy structures in this way may shield the decoupling capacitor from nearby noisy signal sources.

18 Claims, 9 Drawing Sheets

DECOUPLING CAPACITOR CIRCUITRY

BACKGROUND

This relates generally to integrated circuits, and more particularly, to integrated circuits with decoupling capacitors.

Decoupling capacitors are often used to help provide more stable power supply voltages to circuitry on integrated circuits. Decoupling capacitors shunt high frequency noise on direct current (DC) power supply lines to ground power supply lines, thereby preventing the noise from reaching powered circuit components. In a scenario in which a power supply is required to switch between various modes of operation, an adequate decoupling capacitance can act as an energy reserve that lessens the magnitude of undesired dips in power supply voltage during mode switching events.

Advances in integrated circuit design require power supplies to supply stable power for integrated circuits operating at high data rates and clock speeds. This requires increasing amounts of decoupling capacitance per unit integrated circuit area. A large decoupling capacitance could occupy a disproportionate amount of valuable surface area on an integrated circuit.

In order to satisfy strict polysilicon density requirements for modern processes, each decoupling capacitor includes dummy polysilicon structures in close proximity to its polysilicon gate. The polysilicon gate is connected to a power supply line, whereas the dummy polysilicon structures are electrically disconnected from operational circuitry (i.e., the dummy polysilicon structures are not actively driven to any specific voltage level). Integrated circuits that include multiple decoupling capacitor array blocks formed in this arrangement may have a significant portion of available die space occupied by decoupling capacitor circuitry.

SUMMARY

Integrated circuits may include decoupling capacitor circuitry (sometimes referred to as "decap" circuitry). The decoupling capacitor circuitry may be used to reduce the amount of power supply noise present on power supply lines. The decoupling capacitor circuitry may be formed with dummy polysilicon structures to satisfy process density requirements. The dummy polysilicon structures may be used to increase the capacitance of each decoupling capacitor.

Decoupling capacitors may be organized in groups of decoupling capacitors (sometimes referred to as blocks). The decoupling capacitors in each block may be arranged in an array with multiple rows and columns of decoupling capacitors. The decoupling capacitor blocks may have different sizes and shapes and may exhibit different capacitance values.

Each decoupling capacitor in an integrated circuit may have source-drain regions, a conductive gate structure, and associated dummy structures. The gate structure may be connected to a first power supply terminal. The first power supply terminal may be biased to a positive power supply voltage or a ground power supply voltage. At least one of the source-drain regions may be coupled to a second power supply terminal. The second power supply terminal may be biased to a positive power supply voltage or a ground power supply voltage.

The associated dummy structures may be formed adjacent and parallel to the conductive gate structure such that each of the source-drain regions is interposed between the gate and at least one dummy structure. The dummy polysilicon structures may vary in size and shape. The conductive gate structure and dummy structures may be formed from metal, polysilicon, or other conductive materials. Some or all of the dummy structures may be coupled to the second power supply terminal. Some or all of the dummy polysilicon structures may be coupled to at least one of the source-drain regions. Arranged in this way, the dummy polysilicon structures that are coupled to the second power supply terminal may serve to increase the capacitance of that decoupling capacitor (e.g., parallel capacitance may be formed between the gate structure and associated dummy structures that are coupled to a power supply terminal). Individual dummy structures may also provide shielding for each decoupling capacitor so that each decoupling capacitor is isolated from interference, coupling mechanisms, and other undesired sources of noise.

Further features of the present invention, its nature and various advantages will be more apparent from the accompanying drawings and the following detailed description.

DETAILED DESCRIPTION

Embodiments of the present invention relate to integrated circuits with decoupling capacitor circuitry. Integrated circuits include on-chip circuitry that is powered using external power supplies. The external power supplies may be used to supply integrated circuits with power supply voltages. It is generally desirable to maintain the power supply voltages at constant voltage levels.

The amount of power drawn from a power supply may vary during normal operation of an integrated circuit. To accommodate this type of changing power demand while maintaining constant power supply voltage levels, the integrated circuit may include decoupling capacitor circuitry. The decoupling capacitor circuitry may serve as a local energy storage reserve that provides instantaneous current draw. Providing current using the decoupling capacitor circuitry may reduce power supply noise.

Figure 1:
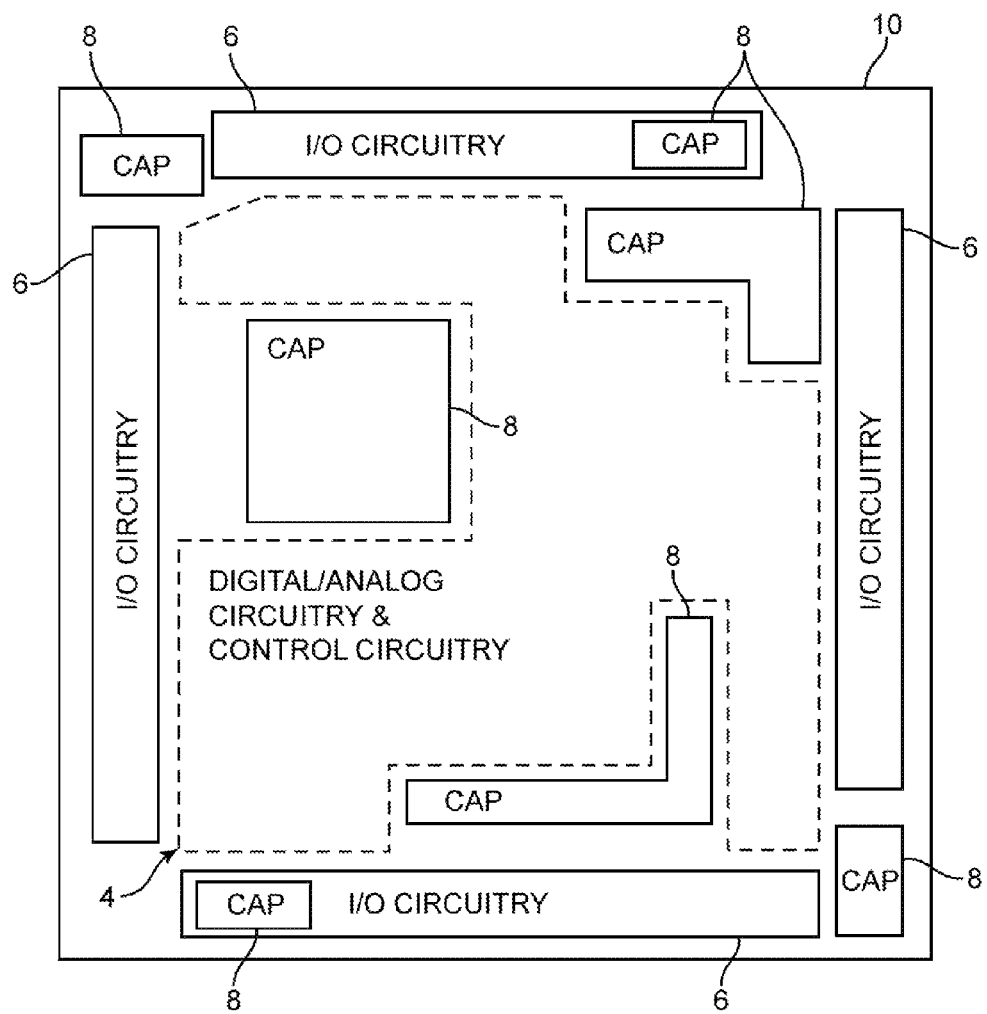
FIG. 1 is a top layout view of an illustrative integrated circuit with decoupling capacitor circuitry in accordance with an embodiment of the present invention.

FIG. 1 shows an integrated circuit that includes internal circuitry such as digital/analog circuitry and control circuitry 4. Integrated circuit 10 may include memory chips, digital signal processing circuits, microprocessors, application specific integrated circuits, programmable integrated circuits, or other suitable integrated circuits.

As shown in FIG. 1, integrated circuit 10 may include blocks of decoupling capacitors such as decoupling capacitor blocks 8. Decoupling capacitor blocks 8 may each include an array of capacitors. As shown in FIG. 1, decoupling capacitor blocks 8 of varying configurations (e.g., decoupling capacitor blocks 8 of different sizes and shapes) may be formed on device 10. Decoupling capacitor blocks 8 may also be formed from combinations of different types of capacitors (e.g. thin oxide capacitors and thick oxide capacitors). Decoupling capacitor blocks 8 may be formed in many locations (e.g. adjacent to I/O circuitry 6, as an integral part of I/O circuitry 6, adjacent to circuits 4 that are sensitive to power supply variation, or at any desired location on device 10). Tens or hundreds of decoupling capacitor array blocks 8 may be formed on device 10, if desired.

Decoupling capacitor blocks 8 may serve to reduce power supply variation at the respective locations on device 10. For example, consider a scenario in which an external power source supplies a 1.2 V positive power supply voltage to device 10. Device 10 may include communications circuitry 4 operating at high data rates (e.g., data rates greater than 1 Gbps). During an idle mode, communications circuitry 4 may draw 0.5 A of current from the power source (as an example). During transmit mode, the communications circuitry may draw 0.7 A of current from the power source. During the mode switch from the idle mode to the transmit mode, decoupling capacitor block 8 located adjacent to communications circuitry 4 on device 10 may serve to provide 0.2 A of current (0.7-0.5) so that communications circuitry 8 receives a constant positive supply voltage of 1.2 V.

Consider another scenario in which the positive power supply experiences an instantaneous voltage glitch. Decoupling capacitor blocks 8 may dampen or absorb this glitch by providing instantaneous current to internal circuitry 4 so that the positive power supply voltage received at the local power supply terminal of circuitry 4 remains constant at 1.2 V (as an example). Decoupling capacitor circuitry 8 used to maintain constant power supply voltage while supplying the desired current draw may be referred to as a ballasting circuit.

Decoupling capacitor blocks 8 formed on device 10 may have large dimensions. For example, a single decoupling capacitor array 8 may measure 400 μm by 200 μm and may have one hundred or more, one thousand or more, or ten thousand or more individual capacitor cells. The size of decoupling capacitor circuitry 8 in modern integrated circuits may occupy a significant percentage of the available die area (e.g., from three to fifteen percent or more).

Decoupling capacitor blocks 8 formed on device 10 may include any suitable combination of thin oxide decoupling capacitors, thick oxide decoupling capacitors, or other suitable decoupling capacitors. For example, decoupling capacitor blocks 8 near circuitry supplied with high power supply voltages (e.g., I/O circuitry 6) may include more thick oxide decoupling capacitors than thin oxide decoupling capacitors (if any), whereas decoupling capacitor blocks 8 near circuitry supplied with low power supply voltages (e.g. digital circuitry 4) may include more thin oxide decoupling capacitors than thick oxide decoupling capacitors (if any).

A significant portion of the area occupied by decoupling capacitor circuitry is reserved for dummy polysilicon structures. In conventional decoupling capacitors, these dummy polysilicon structures are only used to satisfy polysilicon density requirements for a given process. The dummy polysilicon structures in conventional decoupling capacitors are not biased to any specific voltage level during normal integrated circuit operation and are electrically isolated from metal routing lines through which power supply voltages are conveyed.

Figure 2:
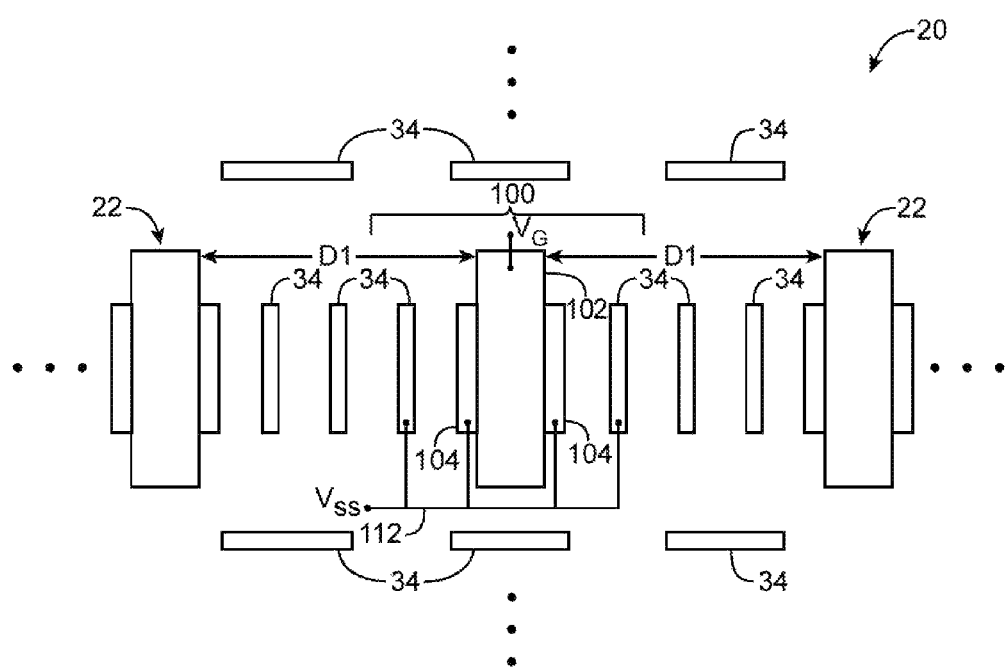
FIG. 2 is a top layout view of a decoupling capacitor having density-compliance structures in accordance with an embodiment of the present invention.

FIG. 2 is a top layout view of an illustrative thin oxide decoupling capacitor 100 having density compliance structures with nearby circuitry.

Polysilicon density requirements for a given process require that the polysilicon density per unit area of an integrated circuit layout meet certain threshold requirements (i.e., the polysilicon density per unit area must be greater than a first threshold value, and the polysilicon density per unit area must be less than a second threshold value). In the example of FIG. 2, integrated circuit structures with polysilicon gates 22 may be formed at distances D1 from polysilicon gate 102 of decoupling capacitor 100. The integrated circuit may violate density requirements for the given process if D1 is not within a certain range. For example, if distance D1 between polysilicon gate 22 and decoupling capacitor polysilicon gate 102 is too large, then the polysilicon density per unit area may be less than the first threshold value, thereby violating density requirements.

Density-compliance structures 34 may be used to satisfy polysilicon density requirements. Density-compliance structures 34 inserted between decoupling capacitor gate 102 and polysilicon gates 22 may serve to increase the polysilicon density per unit area of the integrated circuit to a value above the first density threshold requirement and the below the second density threshold requirement.

As shown in FIG. 2, thin oxide decoupling capacitor 100 may include gate 102 and source and drain regions 104. Gate region 102 may be biased with a voltage Vg. Source-drain regions 104 may be biased with power supply ground voltage Vss through path 112. Source-drain regions 104 may also be coupled to an associated pair of density-compliance structures 34 through metal path 112.

FIG. 2 is merely illustrative. Capacitor 100 may be a thin oxide decoupling capacitor, thick oxide decoupling, or other suitable decoupling capacitor circuitry.

Figure 3:
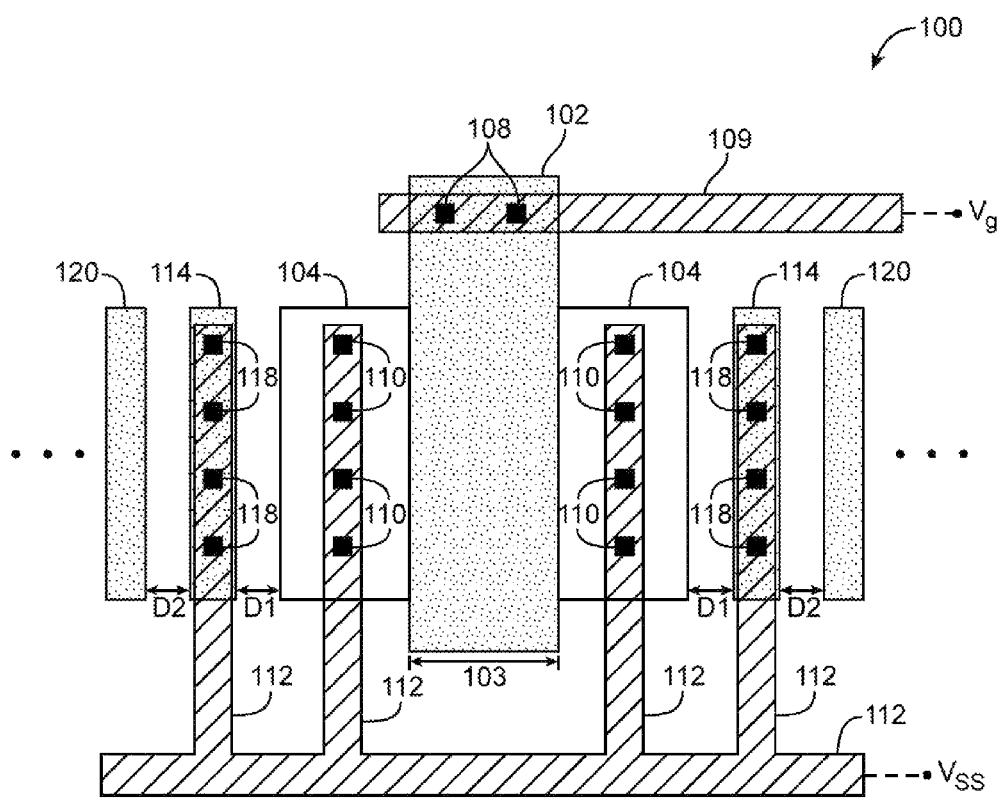
FIGS. 3-6 are top layout views illustrating decoupling capacitors in accordance with an embodiment of the present invention.

FIG. 3 is a top layout view of an illustrative thin oxide decoupling capacitor. As shown in FIG. 3, thin oxide decoupling capacitor 100 may include gate 102 and source and drain regions 104. Source and drain regions 104 are interchangeable and sometimes collectively referred to herein as source-drain regions. Gate 102 may have a gate length 103 that is 0.1 μm to 1.2 μm. Gate region 102 may be coupled to metal path 109 (e.g., a conductive path on which signal Vg may be conveyed) through poly-to-M1 vias 108. Vias 108 are contact structures that couple polysilicon structures to corresponding metal paths formed in a first metal interconnect layer M1. Source-drain regions 104 may be coupled to metal path 112 through source-drain contacts (sometimes referred to as source-drain vias) 110. Source-drain regions 104 may be coupled to metal path 112 with a metal structure sometimes referred to as a finger.

Structures 114 may be formed at a distance D1 from source-drain regions 104 (e.g., a first density-compliance structure may be formed at distance D1 away from a first source-drain region 104, whereas a second density-compliance structure may be formed at distance D1 away from a second source-drain region 104). Dummy structures 120 may be formed at a distance D2 from structures 114 (e.g., first density-compliance structures 114 and 120 associated with the first source-drain region may be separated by distance D2, whereas second density-compliance structures 114 and 120 associated with the second source-drain region may be separated by distance D2). Structures 114 and 120 may run substantially parallel to gate 102. Distances D1 and D2 may be based on density requirements of the process used to fabricate integrated circuit 10. Distance D1 may have a different value than distance D2.

Conductive structures 114 and 120 may be formed from metal or any suitable materials with a density comparable to the density of gate 102. For example, structures 114 and dummy structures 120 may be formed using polysilicon to satisfy polysilicon density requirements (i.e., to ensure the density of the decoupling capacitor substantially match the density of the surrounding circuitry). Density compliance structures such as structures 114 and dummy structures 120 that are used to satisfy density matching requirements may sometimes be referred to as dummy fill structures, dummy gate structures, or ghost structures.

A significant portion of the area occupied by decoupling capacitor 100 is reserved for such types of density-compliance structures. To increase the total capacitance of decoupling capacitor 100 without incurring an increase in area (to more efficiently utilize the area occupied by structures 114), structures 114 may be strapped (coupled) to metal path 112 through poly-to-M1 vias 118. Structures 114 may be strapped to metal path 112 with a metal structure sometimes referred to as a finger. Structures 114 may be driven to power supply voltage Vss through metal path 112 (as an example). Structures 114 coupled using this arrangement may contribute additional capacitance to the total capacitance of decoupling capacitor 100. Using structures 114 to increase the total capacitance of capacitor 100 may therefore increase the capacitance per unit area of decoupling capacitor 100. This allows a circuit designer to reduce the area of each decoupling capacitor block 8 while still providing sufficient decoupling capacitance, thereby freeing up valuable integrated circuit real estate for other operational circuitry.

Decoupling capacitor 100 may be coupled to nearby power supply lines. Path 109 may be coupled to a power supply line on integrated circuit 10 (e.g., Vg may be equal to positive power supply Vdd). Decoupling capacitor 100 may be used to prevent power supply variation on path 109.

Decoupling capacitors 100 used to prevent power supply variations on nearby power supply lines may be sensitive to nearby noisy circuitry. Structures 114 may provide shielding for decoupling capacitor 100 so that capacitive coupling and other coupling mechanisms are minimized (e.g., decoupling capacitor 100 may be isolated from nearby noisy circuitry).

Consider a scenario in which a nearby circuit contains a given conductive path over which a high frequency signal with a large voltage swing is conveyed. Parasitic capacitances exist between decoupling capacitor 100 and the given conductive path. High frequency signaling components of the given conductive path may be coupled into decoupling capacitor 100 through the parasitic capacitances. Grounded structures 114 may provide shielding for decoupling capacitor 100 from the high frequency components (e.g., structures 114 may serve to shunt the coupled high frequency components to ground).

FIG. 3 is merely illustrative. Decoupling capacitor 100 may be flanked by any number of dummy structures (e.g., at least two dummy structures, at least three dummy structures, etc) on either side of gate 102 to satisfy process density requirements. Dummy structures 120 that are strapped using the configuration of FIG. 3 may shield decoupling capacitor 100 from undesired signal sources. Decoupling capacitor 100 may be replicated using the arrangement of FIG. 3 to form a decoupling capacitor array of any size and shape.

Thin oxide decoupling capacitors 100 used to prevent power supply variations may be coupled to low voltage power supply lines. Thin oxide decoupling capacitors 100 may be formed near circuitry on integrated circuit 10 that use lower voltage power supply lines (e.g. digital circuitry 4). The power supply lines to which thin oxide decoupling capacitors 100 are coupled may supply voltages from 0.5V to 1.5V (as an example).

Figure 4:
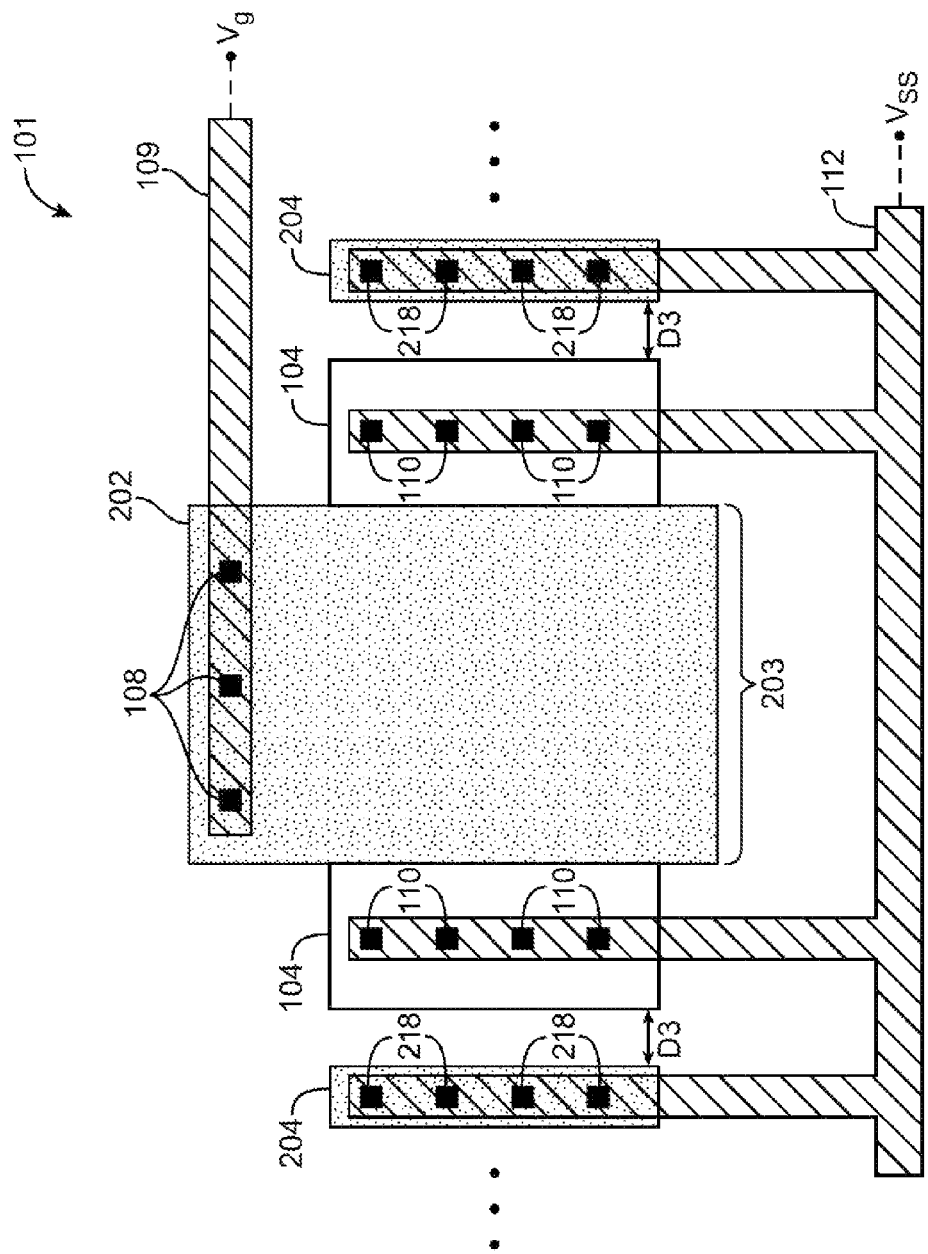

FIG. 4 is a top layout view of an illustrative thick oxide decoupling capacitor. As shown in FIG. 4, thick oxide decoupling capacitor 101 may include gate 202 and source-drain regions 104. Gate region 202 may have a gate length 203 that is greater than gate length 103 of thin oxide decoupling capacitors (FIG. 3). Gate length 103 may have length 0.1 μm to 2.2 μm, or any other suitable length. Gate 202 may be coupled to metal path 109 through poly-to-M1 vias 108. Source-drain regions 104 may be coupled to metal path 112 through source-drain contacts 110.

Density-compliance structures 204 may be formed at a distance D3 from source-drain region 104. To meet process density requirements, distance D3 may be greater than distance D1 (FIG. 3). Structures 204 may run substantially parallel to gate 202.

Thick oxide decoupling capacitors 101 may be coupled to high voltage power supply lines (e.g., signal Vg on path 109 may be driven to positive power supply voltage Vdd). They may be formed near circuitry (e.g., I/O circuitry 6) on integrated circuit 10 that require high voltage power supply lines. The power supply lines to which thick oxide decoupling capacitors 101 are coupled may supply voltages from 2 V to 4 V (as an example).

Figure 5:
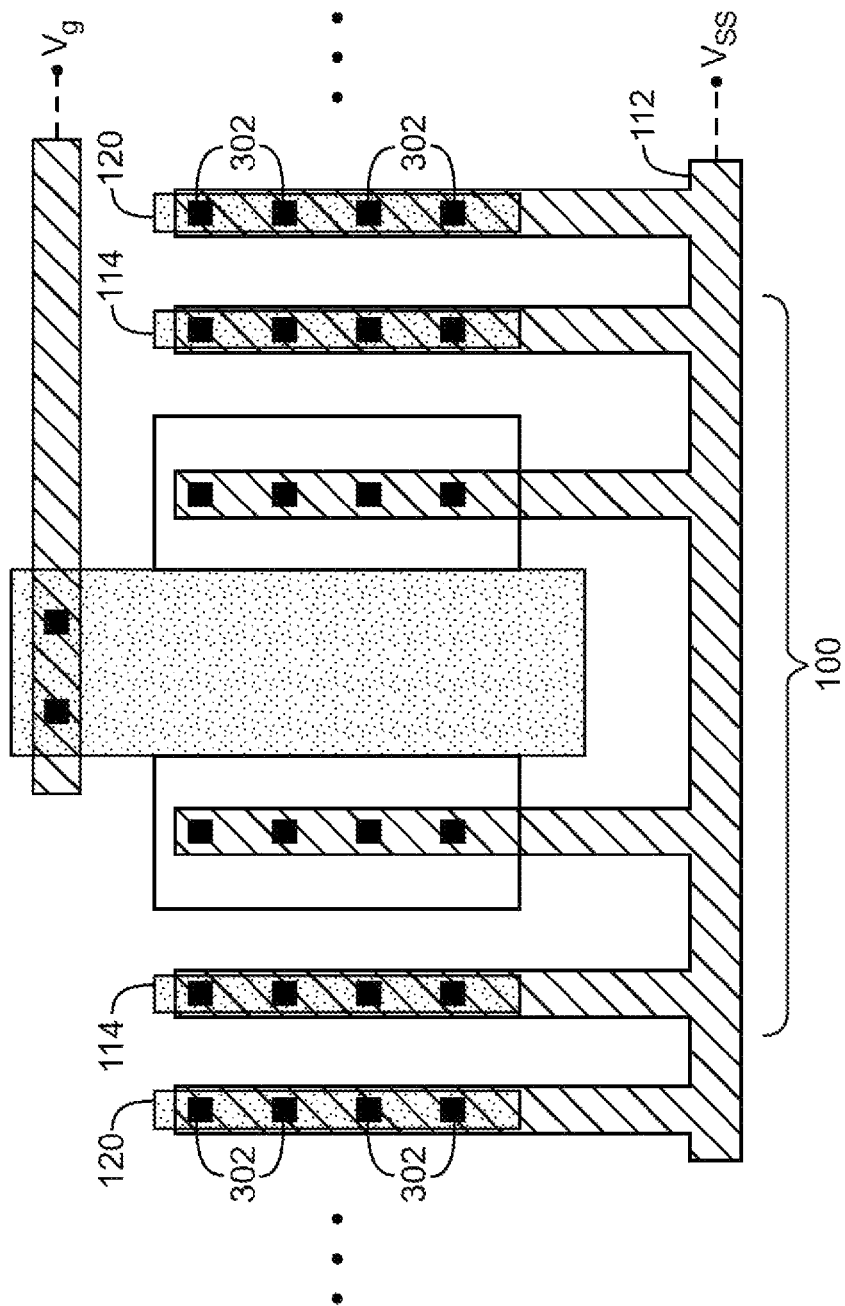

FIG. 5 is a diagram showing another suitable arrangement of a thin oxide decoupling capacitor. As shown in FIG. 5, structures 120 may be strapped to metal path 112 through poly-to-M1 vias 302. Structures 120 may be actively driven to power supply voltage Vss using metal path 112. Structures 120 and 114 biased at power supply voltage Vss may provide shielding for decoupling capacitor 101 from undesired sources.

FIG. 5 is merely illustrative. Decoupling capacitor 100 may be flanked by any number of dummy structures 120 (e.g., at least two dummy structures, at least three dummy structures, etc) to satisfy process density requirements. Additional dummy structures 120 may also be strapped to metal paths 112 through poly-to-M1 vias 302 and biased at power supply voltage Vss through path 112. Additional strapped structures 120 may further provide shielding for decoupling capacitor 100 from undesired sources. Moreover, the addition of strapped structures 120 as described is not limited to thin oxide decoupling capacitor layouts and can be applied to thick oxide decoupling capacitor layouts or any other suitable capacitor configurations.

Figure 6:
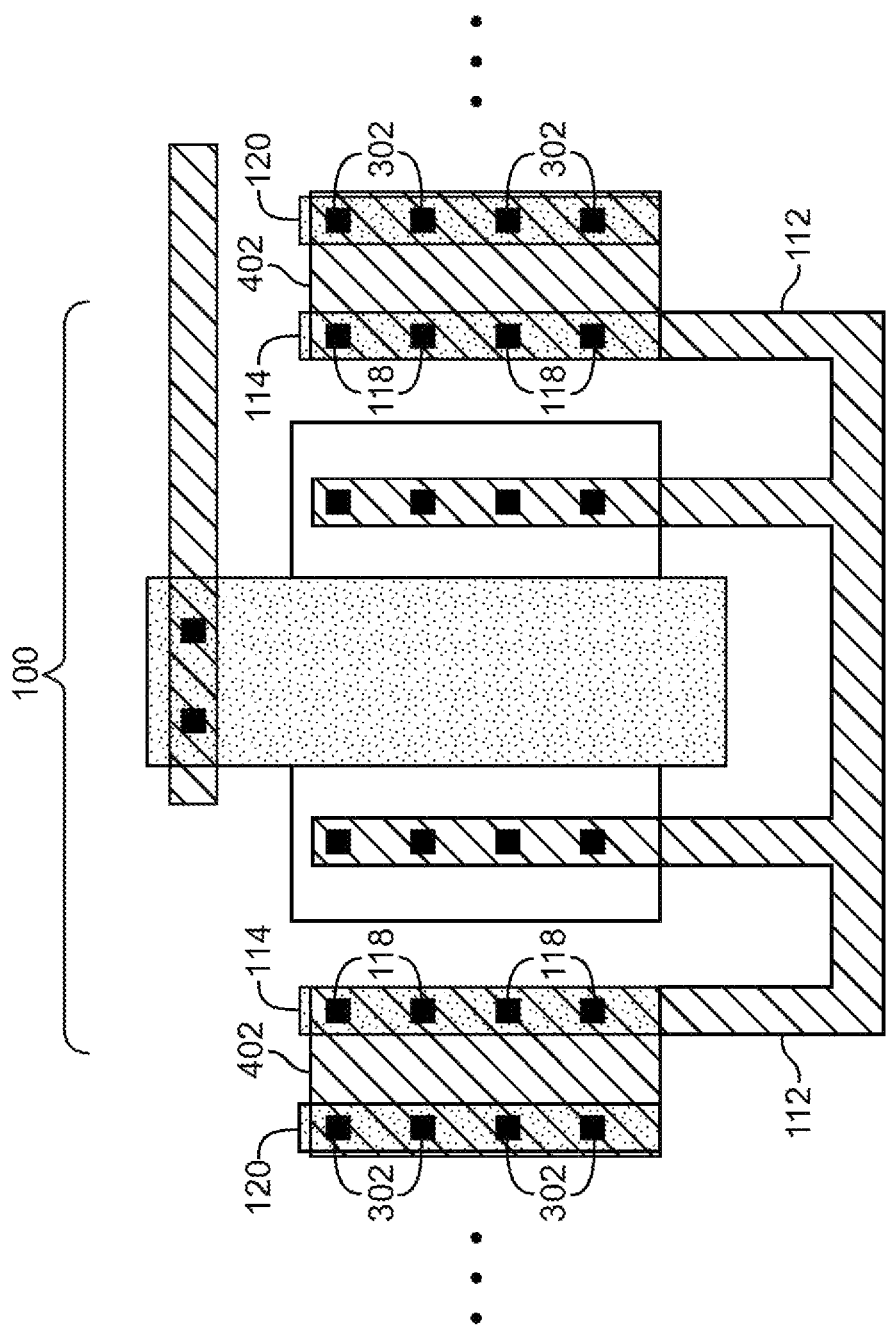

FIG. 6 is a diagram showing another suitable arrangement of a thin oxide decoupling capacitor. As shown in the example of FIG. 6, metal plate portions 402 may be formed over structures 114 and 120. Dummy structures 120 may be coupled to dummy structures 114 through poly-to-M1 vias 302, metal plate portions 402, and poly-to-M1 vias 118. Metal plate portions 402 may be shorted to path 112. Moreover, the coupling of structures 114 to 120 as described is not limited to thin oxide decoupling capacitor layouts and can be applied to thick oxide decoupling capacitor layouts or any other suitable capacitor configurations.

Figure 7:
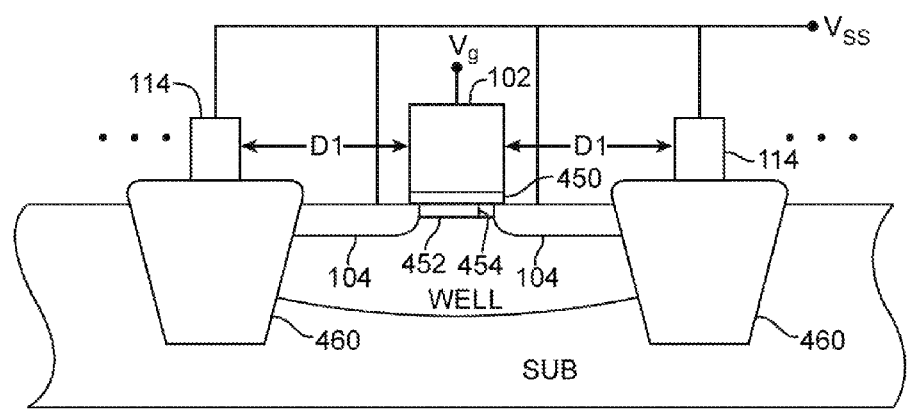
FIG. 7 is a cross-sectional side view of an illustrative decoupling capacitor in accordance with an embodiment of the present invention.

FIG. 7 is a diagram showing the cross-sectional side view of thin oxide decoupling capacitor 100. In the example of FIG. 7, decoupling capacitor 100 may be formed in an n-well in substrate SUB, whereas source-drain regions 104 may be formed from n+ doped regions. If desired, decoupling capacitor 100 may also be formed in a p-well inside a deep n-well, whereas source-drain regions 104 may be formed from p+ doped regions. Density-compliance structures 114 may be formed on shallow trench isolation (STI) structures 460 adjacent to decoupling capacitor 100.

As shown in the example of FIG. 7, the capacitance of decoupling capacitor 100 may include three capacitances C1, C2, and C3.

Capacitance C1 may represent an intrinsic capacitance that is present between gate 102 and the surface of the substrate directly below gate 102. For example, if the n-well is biased at ground voltage Vss, the application of voltage Vg to gate region 102 may result in the formation of accumulation region 452 under oxide layer 450. Capacitance C1 may be dependent on the thickness of the oxide layer 450 and the layout area of gate 102.

Capacitors C2 and C3 may represent parasitic coupling capacitances that exist between structures 114 and gate region 102. The parasitic capacitances of C2 and C3 may depend on the distance 456 between gate region 102 and structures 114 (e.g. capacitances C2 and C3 may be inversely proportional to distance 456). For example, if distance 456 is increased, then capacitances C2 and C3 will decrease. Conversely, if distance 456 is decreased, then capacitances C2 and C3 will increase.

The addition of parasitic capacitances C2 and C3 may result in at least a 5-40% increase in total capacitance over capacitance C1. For example, consider a scenario in which a thin oxide decoupling capacitor has an original capacitance C1 of 18.3 fF. Strapping dummy structures 114 to ground may introduce capacitances C2 and C3 that will increase the capacitance of the thin oxide decoupling capacitor 100 to 24 fF (as an example).

Figure 8:
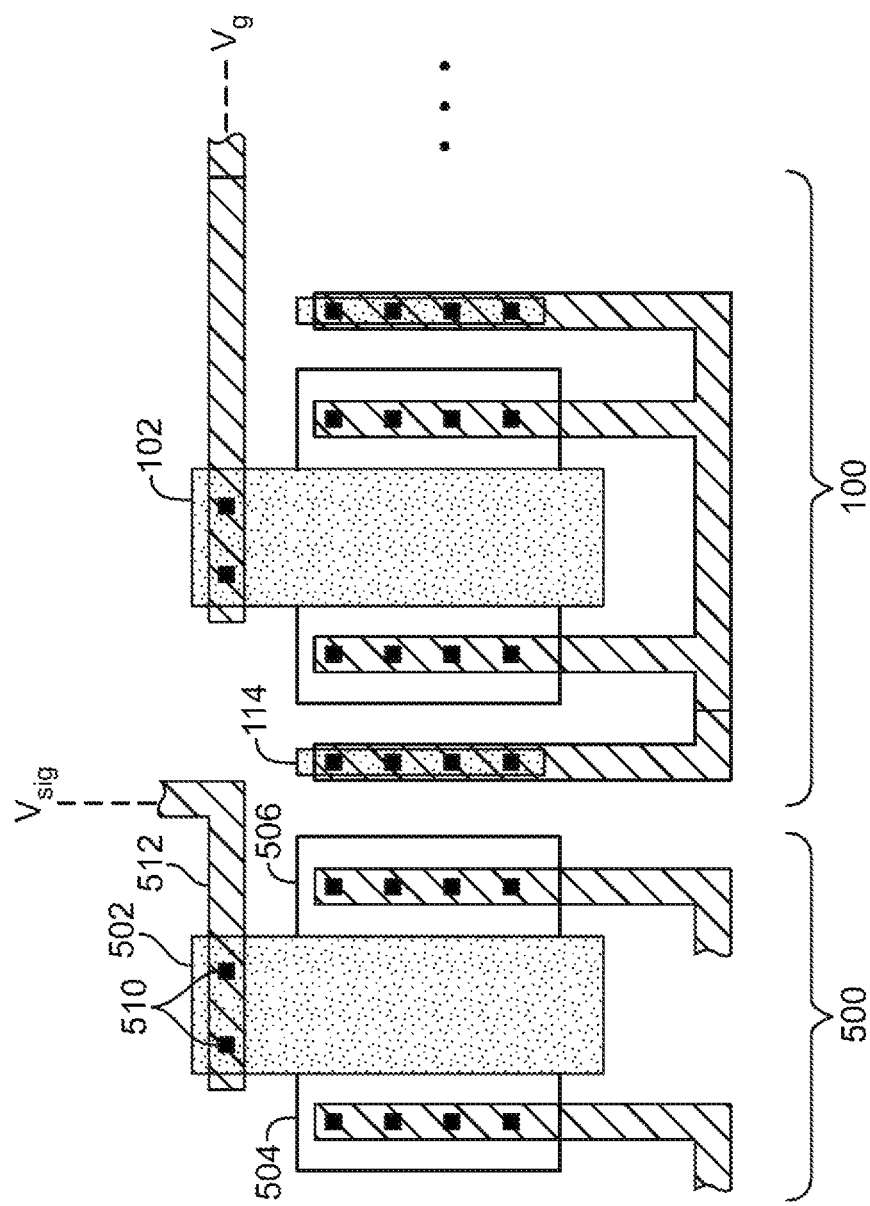
FIG. 8 is a diagram showing a transistor formed adjacent to a decoupling capacitor in accordance with an embodiment of the present invention.

FIG. 8 is a diagram showing decoupling capacitor 100 next to a transistor 500. As shown in the example of FIG. 8, transistor 500 may have a polysilicon gate 502, source region 504, and drain region 506. Transistor gate 502 may be coupled to metal path 512 through poly-to-M1 vias 510. Gate 502 may receive a positive voltage signal Vsig through metal path 512. Due to the close proximity of transistor 500, voltage changes at transistor gate region 502 may be parasitically coupled onto decoupling capacitor 100 (e.g., a change in Vsig may result in a corresponding change in Vg).

Consider a scenario in which voltage signal Vsig transitions from power supply voltage Vss to positive power supply voltage Vcc. This transient step behavior of Vsig may be coupled to decoupling capacitor 100 through parasitic capacitance between gate 502 of transistor 500 and gate 102 of decoupling capacitor 100 if dummy structures 114 are not biased to a power supply voltage.

Figure 9:
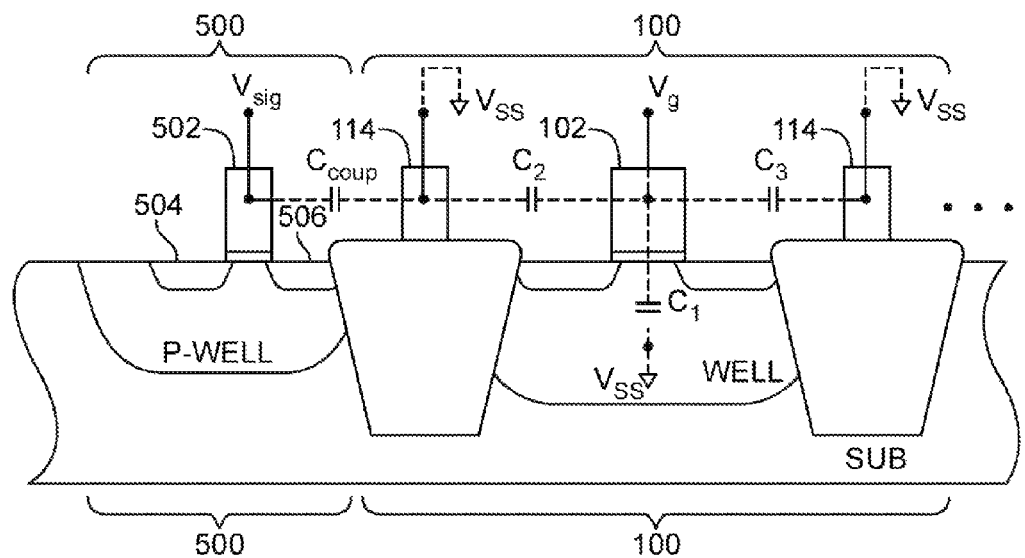
FIG. 9 is the cross-sectional side view of FIG. 9 in accordance with an embodiment of the present invention.

FIG. 9 is a diagram showing the cross-sectional view of transistor 500 and decoupling capacitor 100 of FIG. 8. In the example of FIG. 9, the parasitic coupling of transistor gate region 502 to decoupling capacitor 100 may be represented by a capacitor with capacitance Ccoup. Structures 114 may be tied to ground voltage Vss or other desired voltage levels. The coupling path from Vsig to Vg may be blocked by the grounding of structures 114 to voltage Vss (e.g., any capacitive coupling from circuit 500 will be absorbed by structure 114 and will not affect the behavior of signal Vg).

Consider the case in which Vsig represents a signal that experiences an instantaneous large voltage swing. The grounding of structure 114 may shunt the current flow through parasitic capacitor Ccoup so that signal Vg of decoupling capacitor 100 is unaffected by any voltage change in Vsig.

Figure 10:
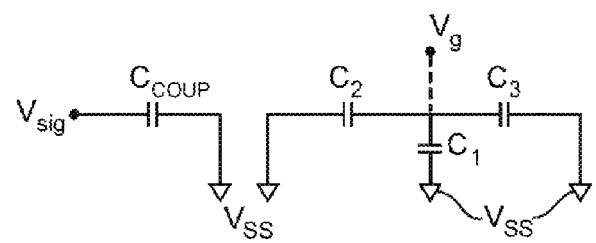
FIG. 10 is a schematic diagram illustrating parasitic capacitance associated with the circuitry of FIGS. 9 and 10 in accordance with an embodiment of the present invention.

FIG. 10 is a diagram showing a representative circuit of transistor 500 and decoupling capacitor 100 of FIGS. 9 and 10. Capacitor C1 and parasitic capacitors C2 and C3 may be coupled in parallel between signal Vg and power supply line Vss. The effective capacitance of the parallel combination of C1, C2, and C3 has a value that is the sum of capacitances of C1, C2, and C3.

Because capacitance Ccoup and the parallel effective capacitance of C1, C2, and C3 are grounded to Vss, signal Vg is isolated from transistor signal Vsig (i.e., capacitive coupling due to Ccoup will be absorbed by power supply grounding). For example, any current flow through parasitic capacitor Ccoup due to changes in signal Vsig will be shunted to ground terminal Vss and will not affect signal Vg.

The foregoing is merely illustrative of the principles of this invention and various modifications can be made by those skilled in the art without departing from the scope and spirit of the invention.

What is claimed is:

1. An integrated circuit comprising:
   first and second terminals;
   a semiconductor substrate;
   a layer of insulator on the semiconductor substrate;
   a conductor on the layer of insulator configured to serve as a first conductive structure for an integrated circuit capacitor, wherein the conductor is electrically coupled to the first terminal; and
   at least one density compliance structure that is electrically coupled to the second terminal and that is configured to serve as a second conductive structure for the integrated circuit capacitor, wherein the density compliance structure comprises polysilicon and wherein the conductor comprises a polysilicon gate structure.

2. The integrated circuit capacitor defined in claim 1 further comprising:
   source-drain regions in the semiconductor substrate adjacent to the polysilicon gate structure, wherein the source-drain regions are coupled to the second terminal.

3. The integrated circuit capacitor defined in claim 2 further comprising:
   a doped well in the semiconductor substrate, wherein a portion of the doped well lies under the layer of insulator, and wherein the source-drain regions are formed in the doped well.

4. The integrated circuit capacitor defined in claim 3, wherein the doped well comprises an n-well, and wherein the source-drain regions comprise n+ doped regions.

5. The integrated circuit capacitor defined in claim 3, wherein the doped well comprises a p-well, and wherein the source-drain regions comprise p+ doped regions.

6. An integrated circuit comprising:
   first and second terminals;
   a semiconductor substrate;
   a layer of insulator on the semiconductor substrate;
   a conductor on the layer of insulator configured to serve as a first conductive structure for an integrated circuit capacitor, wherein the conductor is electrically coupled to the first terminal;
   at least one density compliance structure that is electrically coupled to the second terminal and that is configured to serve as a second conductive structure for the integrated circuit capacitor; and
   source-drain regions in the semiconductor substrate, wherein the source-drain regions are coupled to the second terminal.

7. The integrated circuit capacitor defined in claim 6 further comprising:
   a metal structure that is electrically coupled to the second terminal, that has at least one finger coupled to the source-drain regions, and that has at least one finger coupled to the density compliance structure.

8. The integrated circuit capacitor defined in claim 6, wherein the at least one density compliance structure comprises first and second density compliance structures, the integrated circuit capacitor further comprising:
- a metal structure that is electrically coupled to the second terminal, that has a first finger coupled to one of the source-drain regions, that has a second finger coupled to the first density compliance structure, and that has a third finger coupled to the second density compliance structure.

9. The integrated circuit capacitor defined in claim 8, wherein the first density compliance structure is interposed between the second density compliance structure and the source-drain region to which the first finger is coupled.

10. The integrated circuit capacitor defined in claim 6, wherein the at least one density compliance structure comprises first and second density compliance structures, the integrated circuit capacitor further comprising:
- a metal structure that is coupled to the second terminal, wherein the metal structure includes a path coupled to one of the source-drain regions and a metal plate portion that overlaps both the first and second density compliance structures, wherein the metal structure is electrically coupled to the first density compliance structure and the second density compliance structure, and wherein the first density compliance structure is interposed between the second density compliance structure and the source-drain region to which the metal structure is coupled.

11. An integrated circuit comprising:
- a power supply line;
- a semiconductor substrate;
- a layer of insulator on the semiconductor substrate;
- a conductor on the layer of insulator; and
- at least one density compliance structure that is electrically coupled to the power supply line, wherein the density compliance structure and the conductor form a capacitive structure, wherein the conductor comprises a polysilicon gate.

12. The integrated circuit capacitor defined in claim 11, wherein the at least one density compliance structure comprises pollysilicon.

13. The integrated circuit capacitor defined in claim 11, further comprising:
- shallow trench isolation structures formed in the semiconductor substrate, wherein the density compliance structure is disposed over the shallow trench isolation structures.

14. The integrated circuit capacitor defined in claim 11, further comprising:
- an additional power supply line, wherein the additional power supply line is coupled to the conductor.

15. A method of forming an integrated circuit, comprising:
forming a layer of insulator on a semiconductor substrate;
forming a first conductive structure for an integrated circuit capacitor by forming a gate structure on the layer of insulator;
forming first and second source-drain regions in the semiconductor substrate adjacent to the gate structure;
forming a second conductive structure for the integrated circuit capacitor by forming at least one density compliance structure on the semiconductor substrate; and
coupling the density compliance structure to the first source-drain region to increase the capacitance of the integrated circuit capacitor.

16. The method defined in claim 15, further comprising:
coupling a power supply line to the at least one density-compliance structure.

17. The method defined in claim 15, further comprising:
coupling the gate structure to a power supply path.

18. The method defined in claim 15, further comprising:
shorting the first source-drain region and the second source-drain region.

\* \* \* \* \*